United States Patent
Singh

(10) Patent No.: US 8,848,474 B2
(45) Date of Patent: Sep. 30, 2014

(54) CAPACITIVE COUPLED SENSE AMPLIFIER BIASED AT MAXIMUM GAIN POINT

(71) Applicant: LSI Corporation, Milpitas, CA (US)

(72) Inventor: Sahilpreet Singh, Karnataka (IN)

(73) Assignee: LSI Corporation, San Jose, CA (US)

( * ) Notice: Subject to any disclaimer, the term of this patent is extended or adjusted under 35 U.S.C. 154(b) by 118 days.

(21) Appl. No.: 13/746,653

(22) Filed: Jan. 22, 2013

(65) Prior Publication Data
US 2014/0204659 A1 Jul. 24, 2014

(51) Int. Cl.
*G11C 7/00* (2006.01)
*G11C 7/06* (2006.01)

(52) U.S. Cl.
CPC .................. *G11C 7/065* (2013.01)
USPC ............ 365/205; 365/156; 365/207; 365/203

(58) Field of Classification Search
USPC .................. 365/205, 154, 156, 207, 203, 204
See application file for complete search history.

(56) References Cited

U.S. PATENT DOCUMENTS

| | | | |
|---|---|---|---|
| 7,715,262 B2 | 5/2010 | Afghahi et al. | |
| 7,729,189 B2 | 6/2010 | Forbes | |
| 7,782,697 B2 | 8/2010 | Terzioglu et al. | |
| 8,687,448 B2 * | 4/2014 | Kawasumi | 365/203 |
| 2012/0069636 A1 | 3/2012 | Pelley et al. | |

* cited by examiner

*Primary Examiner* — David Lam

(57) ABSTRACT

A sense amplifier includes a first inverter including a first input node and a first output node, the first input node coupled to a first bitline through a first capacitor, the first output node coupled to a second bitline through a second capacitor, a second inverter including a second input node and a second output node, the second input node coupled to the second bitline through the second capacitor, the second output node to the first bitline through the first capacitor, a first transmission gate switch coupled between the first input node and the second input node, a second transmission gate switch coupled between a first common node of the first and second inverters and a second common node of the first and second inverters. The sense amplifier is maintained at a maximum gain point in a read cycle.

20 Claims, 9 Drawing Sheets

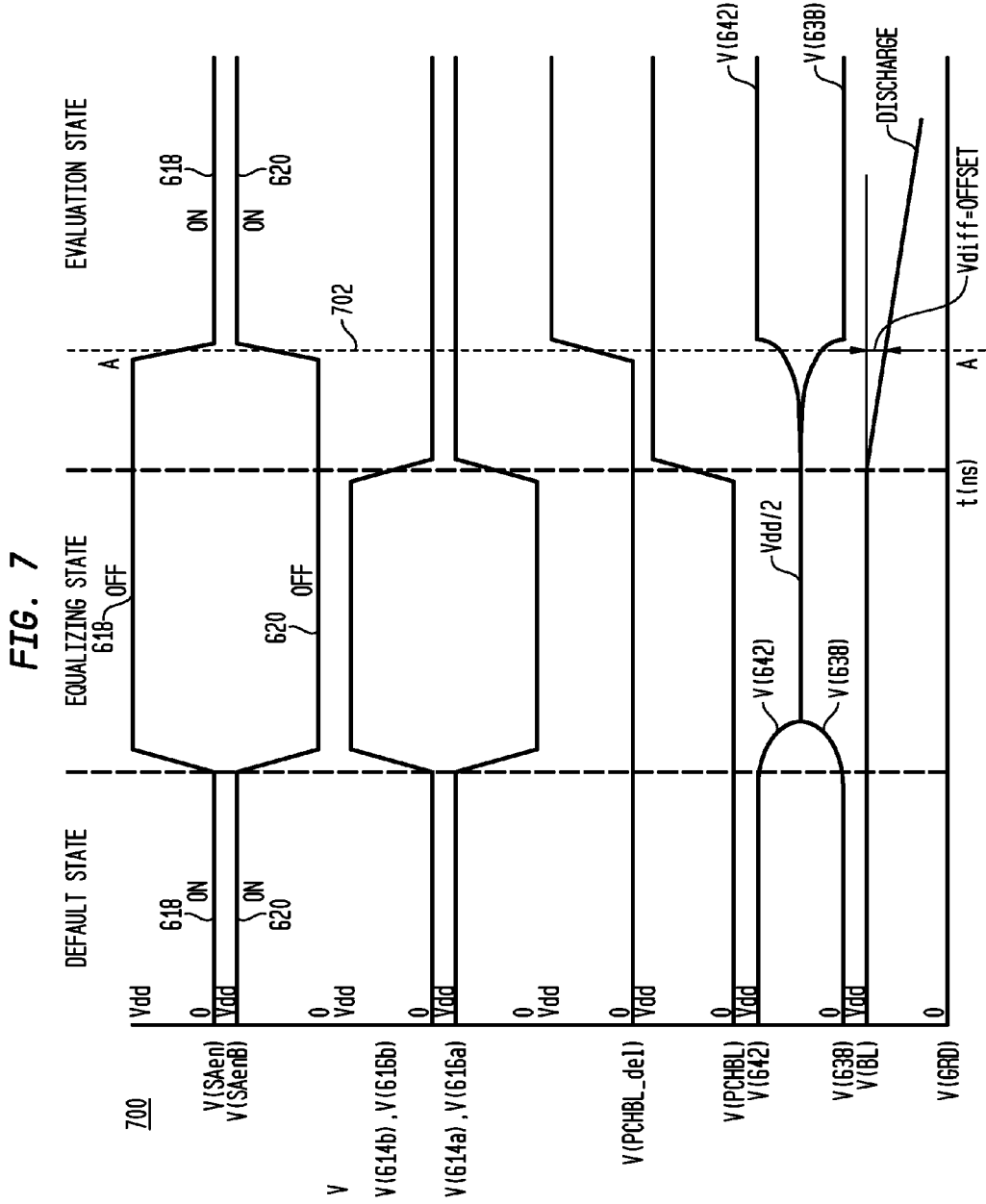

802 — STARTING A DEFAULT STATE OF A SENSE AMPLIFIER WITH PRECHARGING BITLINES BL AND BLb TO Vdd, CONNECTING THE BL (BLB) TO A GBL (GBLB), SWITCHING TRANSMISSION GATE SWITCHES OFF AND COMMON NODE TRANSISTORS OF THE SENSE AMPLIFIER ON

804 — WHEN A READ OPERATION STARTS, EXECUTING AN EQUALIZING STATE OF THE SENSE AMPLIFIER WITH THE TRANSMISSION GATE SWITCHES ON AND THE COMMON NODE TRANSISTORS OFF, WHEREIN INTERNAL NODES OF THE SENSE AMPLIFIER MIGHT BE EQUALIZED AND MAINTAINED AT Vdd/2

806 — AFTER THE EQUALIZING STATE, MOVING THE SENSE AMPLIFIER TO THE EVALUATION STAGE, WHEREIN A WORDLINE IS SWITCHED ON, THE PRECHARGE OF THE SENSE AMPLIFIER IS SWITCHED OFF, THE GBL OR GBLB IS DISCHARGED, SUBSEQUENTLY THE DISCHARGE OF THE GBL OR GBLB IS TRANSFERRED TO THE RESPECTIVE BL OR BLB THROUGH MUX PASSAGES AND THE DISCHARGE OF THE BL OR BLB IS TRANSFERRED TO THE RESPECTIVE INTERNAL NODES OF THE SENSEAMP THROUGH RESPECTIVE COUPLING TRANSISTORS, THE MUX PASSGATES ARE THEN TURNED OFF TO DECOUPLE THE GBL FROM THE BL AND THE GBLB FROM THE BLB, AND FINALLY THE INTERNAL NODES OF THE SENSE AMPLIFIER START TO CHANGE TO STABLE STATES

808 — AT THE EVALUATION STATE, WHEN A VOLTAGE DIFFERENCE FROM THE BL TRANSFERS FROM A CAPACITOR TO THE INTERNAL NODE TO A CERTAIN POINT, SWITCHING THE COMMON NODE TRANSISTORS ON, TRAVELING Vdd/2 FOR THE INTERNAL NODES TO REACH TO THE STABLE STATES RESULTING IN THE SENSE AMPLIFIER BIASED AT A MAXIMUM GAIN POINT

CAPACITIVE COUPLED SENSE AMPLIFIER BIASED AT MAXIMUM GAIN POINT

BACKGROUND

A sense amplifier (senseamp) is typically used to sense and refresh a bit value stored in a memory cell of a random access memory (RAM) such as, for example, a static random access memory (SRAM). The SRAM memory system is typically based on an array-structured memory architecture, which includes a plurality of sense amplifiers. The sense amplifier is a positive feedback device that pushes a readout voltage level to logic 1 (or high) or logic 0 (or low) with relatively high speed.

FIG. 1 is a block diagram of an embodiment of SRAM 100 having critical paths marked with thick shadow arrows. A read operation includes exemplary data paths A, B, C and D from global control 102 to memory array 108, and from global control 102 to read/write (RD/WR) circuit 112 and senseamp circuit 110. Such a read operation might have a long path delay. Thus, the read operation determines a read/write (RD/WR) operating frequency. The read path delay is primarily determined by the delay of global control 102 (e.g., an address register delay), the delay of row decoder 104, the access speed of SRAM cell 108 and the delay of senseamp circuit 110.

For a single data, bit input/output of SRAM 100, a single address of N+M bits is split into N row addresses and M column addresses. The row address is first decoded, so that one out of $2^N$ word lines in the memory array (of size $2^N \times 2^M$) is selected. SRAMs are usually built so that all cells in the same row are activated. Consequentially, all $2^M$ bitline pairs form the columns leaving the memory array contain data. In a read operation, column decoder 106 selects one of these word line pairs based on the column address. Typically, a signal from each cell for example, cell 114, is sense-amplified by a sense amplifier in senseamp circuit 110, and stored in a data read buffer of RD/WR circuit 112. Differential bitlines, BL and BLB, emanating from cell 114 are provided to senseamp circuit 110, which pulls up a voltage differential between bitlines BL and BLB to a full level of the voltage differential. A signal is then gated out of the sense amplifier.

FIG. 2 is a schematic view of commonly used conventional implementation of sense amplifier 200. As shown in FIG. 2, sense amplifier 200 is a voltage latched based sense amplifier, which has a back to back inverter latch 210. As shown, internal nodes 202, 204 (INN, INP) of sense amplifier 200 are maintained at an unstable point and both are maintained at a drain supply voltage $V_{dd}$, rather than at a maximum gain point of $V_{dd}/2$. Sense amplifier 200 includes internal node INN 202, and INP 204, precharge circuit 206, load access elements 208 and 210, back to back inverters 212, output drivers 214, 216, and NMOS M5. Precharge circuit 206 includes PMOS transistors M6, M7 and M8 to precharge complimentary bitlines BL and BLB with a sense amplifier pre-charge signal (SAPRE). Load access element 208 includes capacitor $C_{BL}$ 220 and PMOS 222. PMOS 222 is configured as a transfer gate, allowing BL terminal to be connected to a storage node of capacitor $C_{BL}$ 220 under the control of SAPRE. One of the source/drain electrodes of PMOS 222 is connected, to the storage node of capacitor $C_{BL}$ 220, the other source/drain electrode of PMOS 222 is connected to BL, and the gate electrode of PMOS 222 is connected to SAPRE signal. Load access element 210 includes capacitor $C_{BLB}$ 224, PMOS 226 and current source $I_{in}$ 228. PMOS 226 is configured as a transfer gate, allowing BLB terminal to be connected to a storage node of capacitor $C_{BLB}$ 224 wader the control of SAPRE. One of the source/drain electrodes of PMOS 226 is connected to the storage node of capacitor $C_{BLB}$ 224 and current source $I_{in}$ 228, the other source/drain electrode of PMOS 226 is connected to BLB, and the gate electrode of PMOS 226 is connected to SAPRE signal. Current source $I_{in}$ 228 is in parallel with capacitor $C_{BLB}$ 224 between the one of the source/drain electrodes of PMOS 226 and ground. Back to back inverters 212 includes NMOS transistors M1 and M2, and PMOS transistors M3 and M4 forming a cross-coupled latch. Output drivers 214, 216 each has one NMOS transistor and one PMOS transistor, which connect between the drain-to-drain, or power-supply, voltage, $V_{dd}$, and ground, to generate an inversion in the output of internal node 202 or 204 of sense amplifier 200. NMOS transistor M5 is connected at the common nodes of NMOS transistor M1 and M2 and driven by a sense amplifier enable signal (SAen). Internal node INN 202 and internal node INP 204 are each precharged to $V_{dd}$. When a read operation starts, depending on data to be read, either a voltage of BL or a voltage of the BLB starts to fall. If the voltage of BLB falls, the voltage of internal node INP 204 also starts to fall. As the voltage of internal node INP 204 falls to a level of an offset of sense amplifier 200, sense amplifier 200 is decoupled from BLB and the SAen signal is switched ON. This results in the cross-coupled latch in an unbalanced state. As such, a latching action of the cross-coupled latch automatically brings the voltage of internal node INP 204 to logic 0 and internal node INN 202 to $V_{dd}$, which is read at a memory output. Thus, internal node INN 202 and internal node INP 204 are kept at an unstable state point, instead of at a maximum gain point. Furthermore, a load of sense amplifier 200 also affects data carried by BL and BLB because of a direct connection of internal nodes 202, 204 and BL and BLB. Thus, sense amplifier 200 is generally not employed in designs with small bitlines.

In dual rail compilers the conventional sense amplifier also has limitations as the sense amplifier has to share a same voltage supply with the bitlines, increasing a consumption of the voltage supply of the array.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide a sense amplifier coupled between a complementary pair of first and second bitlines that are coupled to respective first and second global bitlines in a static random access memory (SRAM) cell. The sense amplifier includes a first inverter including a first input node and a first output node, the first input node coupled to the first bitline through a first capacitor, the first output node coupled to the second bitline through a second capacitor, a second inverter including a second input node and a second output node, the second input node coupled to the second bitline through the second capacitor, the second output node to the first bitline through the first capacitor, a first transmission gate switch coupled between the first input node and the second input node, and a second transmission gate switch coupled between a first common node of the first and second inverters and a second common node of the first and second inverters. The sense amplifier is maintained at a maximum gain point in a read cycle of the SRAM cell.

BRIEF DESCRIPTION OF THE DRAWING FIGURES

Other aspects, features, and advantages of described embodiments will become more fully apparent from the following detailed description, the appended claims, and the accompanying drawings in which like reference numerals identify similar or identical elements.

FIG. 7 is an exemplary timing diagram of the capacitive coupled sense amplifier shown in FIG. 6; and FIG. 8 is a flowchart showing a method for sensing a bitline voltage difference in a SRAM by the capacitive coupled, sense amplifier shown in FIGS. 3A-3B in accordance with exemplary embodiments.

DETAILED DESCRIPTION

Described embodiments relate to sensing a bitline voltage difference ($V_{diff}$) in static random access memory (SRAM). In the described embodiments, internal nodes of a sense amplifier in the SRAM might be maintained at a relatively highest (or maximum) gain point (e.g., at a half of a drain supply voltage ($V_{dd}/2$)). The bitline voltage differences are transferred to the internal nodes of the sense amplifier through capacitance between the bitlines and the internal nodes. More specifically, a mean of the sense amplifier offset might be gained as follows. The internal nodes of the sense amplifier are decoupled from the bitline capacitance. The margin added to the mean of the sense amplifier offset due to the difference in the level of the bitlines might be substantially reduced or eliminated. At the maximum gain point a reaction time might be very small and the sense amplifier offset mean might be reduced. Since load of the sense amplifier exhibits little or no effect to bitlines in the described embodiments, a memory having small bitlines might employ sense amplifier sensing techniques as disclosed in the described embodiments, gaining speed in access time and reducing dynamic power consumption. Embodiments might also be used in compilers with rows ranging from small to large numbers. Furthermore, embodiments might decouple each bitline from the sense amplifier so that the sense amplifier and bitlines might be at different voltage supplies, allowing embodiments to be employed in dual rail compilers. Since the described embodiments reduce reaction time and evaluation time, embodiments further reduce power consumption of the sense amplifier.

Hereinafter, exemplary embodiments are described with reference to the drawings.

Figure 1:
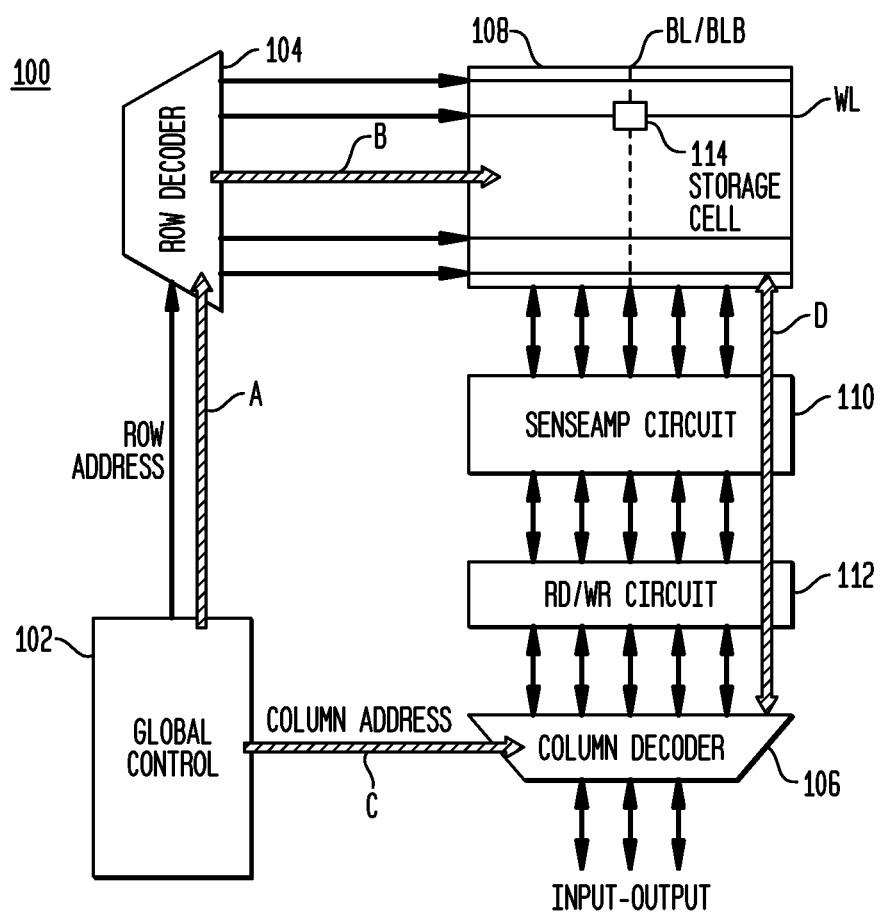
FIG. 1 is a block diagram of an embodiment of a SRAM of the prior art.
Figure 2:
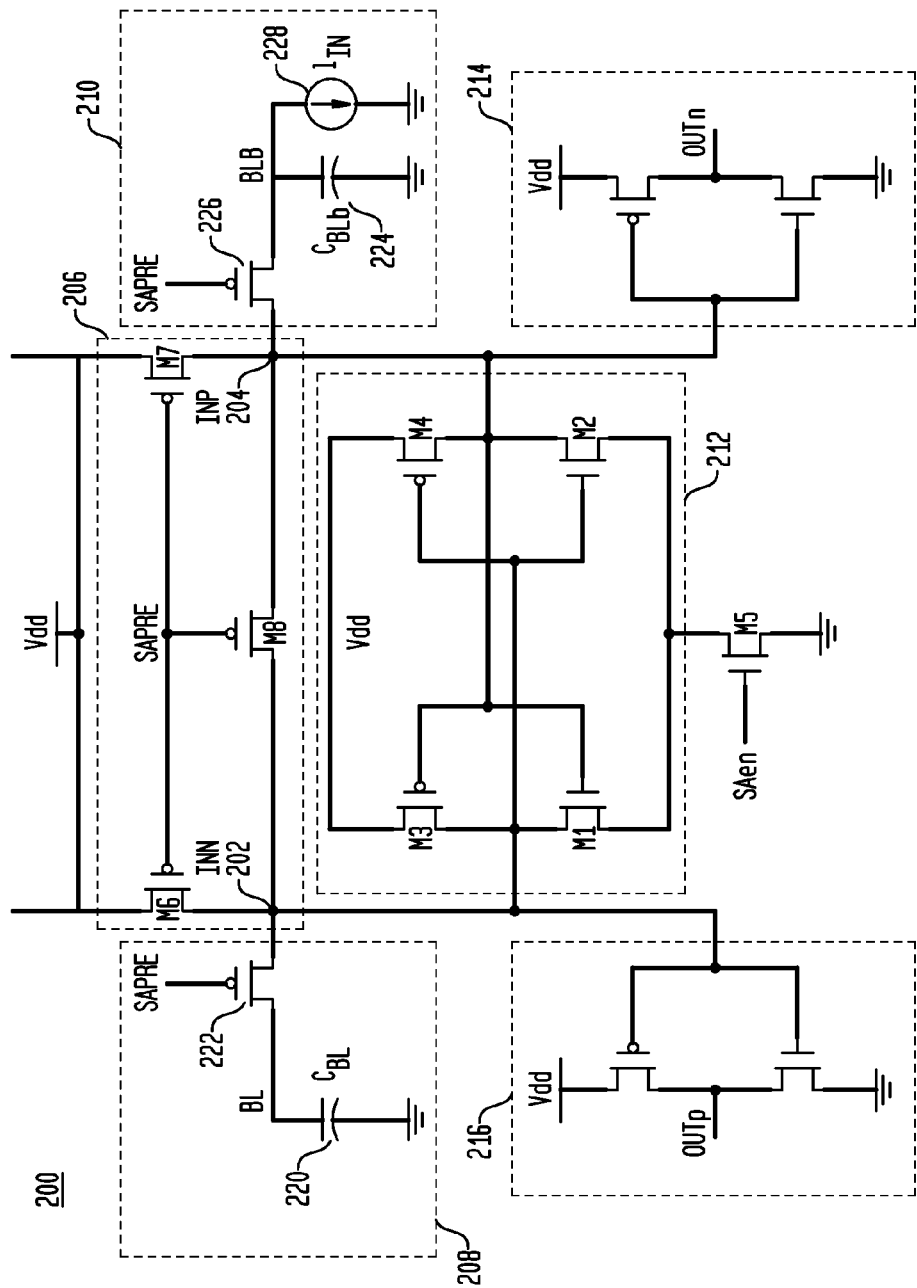
FIG. 2 is a schematic view of a conventional sense amplifier of the prior art.
Figure 3A:
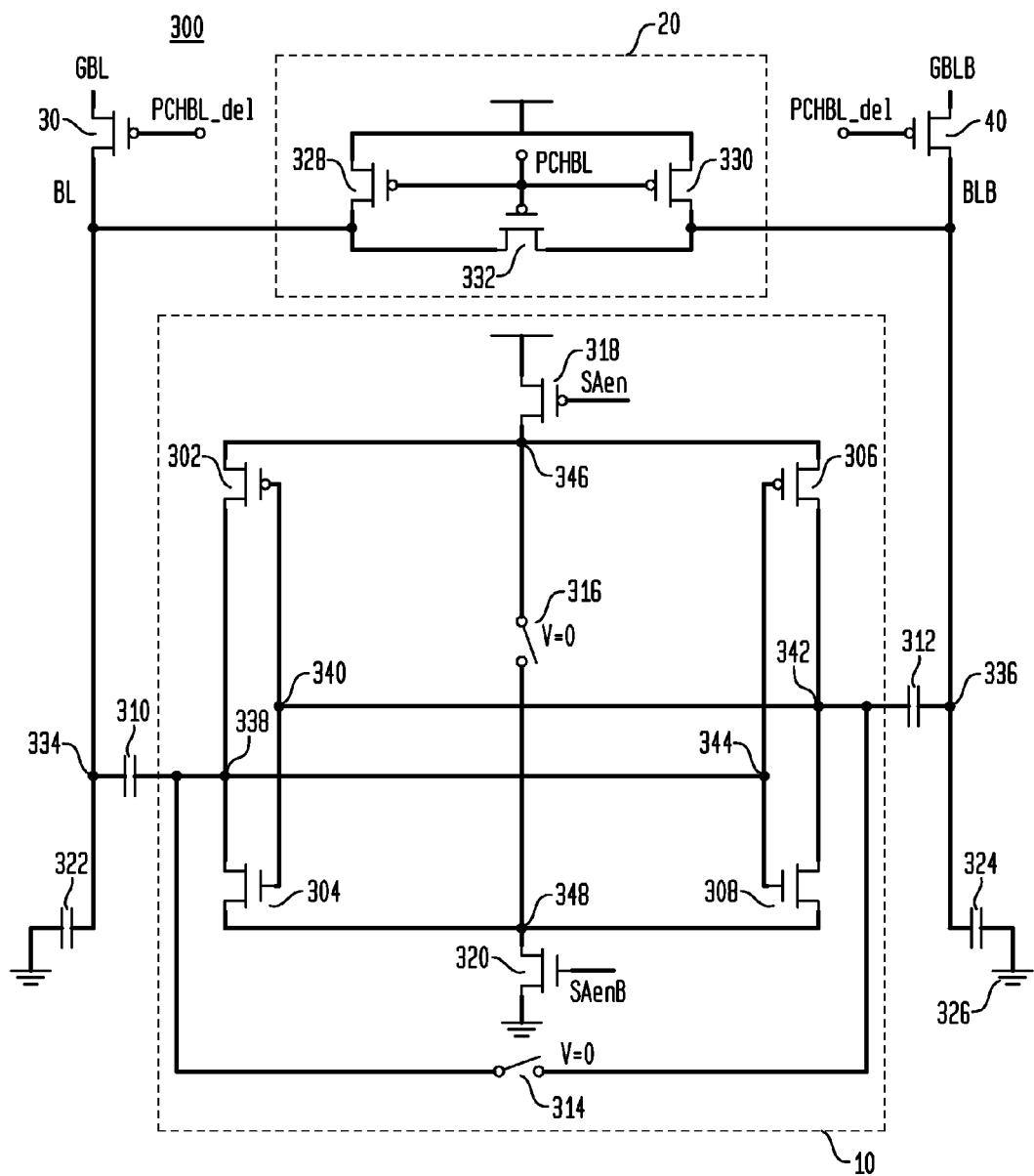
FIG. 3A is a schematic view of a capacitive coupled sense amplifier in a default state in accordance with exemplary embodiments.
Figure 3B:
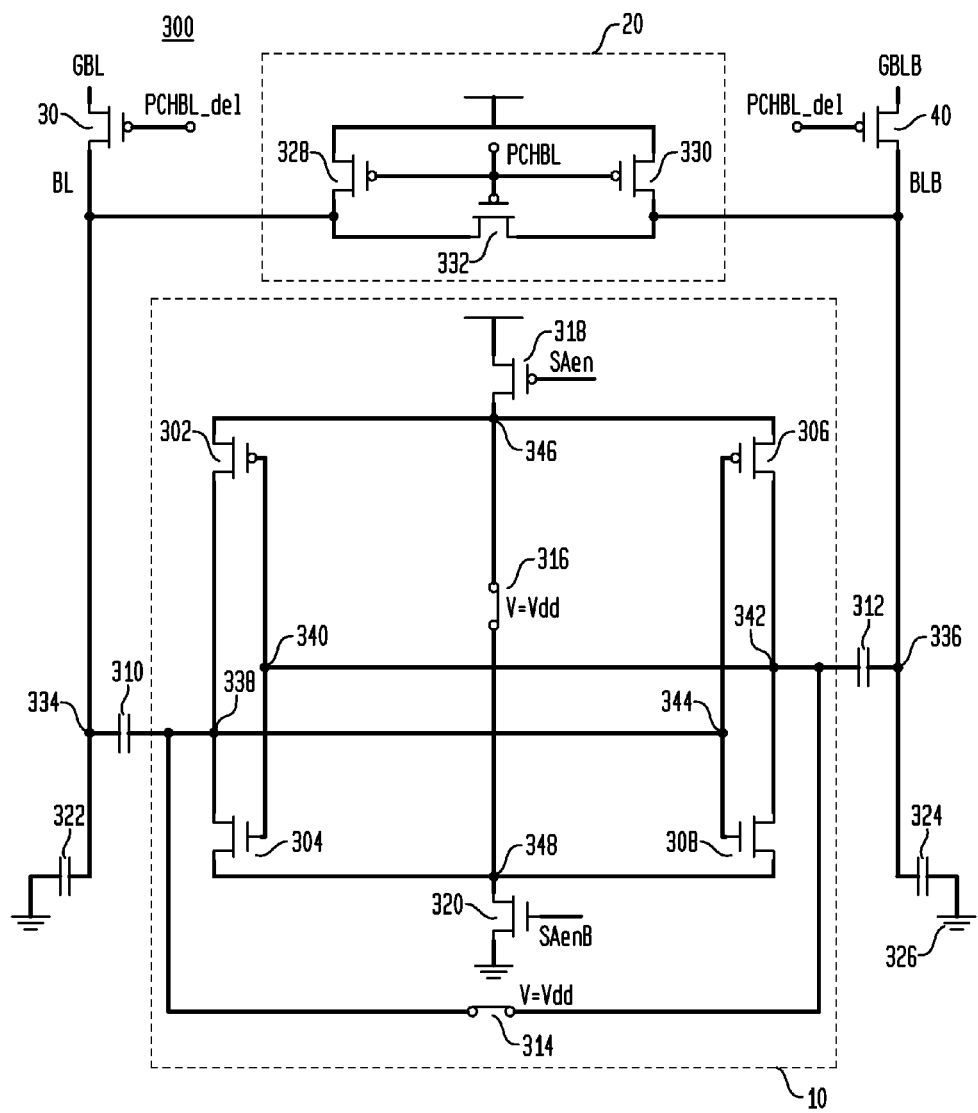
FIG. 3B is a schematic view of a capacitive coupled sense amplifier in an equalizing state in accordance with exemplary embodiments.

FIG. 3A and FIG. 3B are schematic views of a capacitive coupled sense amplifier in accordance with exemplary embodiments. FIG. 3A shows the capacitive coupled sense amplifier in a default state with transmission gate switches open (OFF), while FIG. 3B shows the capacitive coupled sense amplifier in an equalizing state with the transmission gate switches closed (ON).

As shown in FIG. 3A and FIG. 3B, sense amplifier 10 might be coupled between a complementary pair of bitlines, shown as BL and BLB, in a SRAM cell, through capacitor 310 and capacitor 312. Sense amplifier circuit 300 might include sense amplifier 10, precharge circuit 20, multiplexer (MUX) passgates 30 and 40, and capacitors 310, 312, 322 and 324. Sense amplifier 10 might include a first inverter having PMOS transistor 302 and NMOS transistor 304, a second inverter having PMOS transistor 306 and NMOS transistor 308, transmission gate switch 314, transmission gate switch 316, common node PMOS transistor 318, and common node NMOS transistor 320. Precharge circuit 20 might include PMOS transistors 328, 330 and 332. Multiplexer (MUX) passgates 30 and 40 might provide sense amplifier 10 with the BL and BLB from global bitlines shown as GBL and GBLB.

Signal BL might include bitline node 334. Signal BLB might include bitline node 336. The first inverter might include input node 338 and output node 340. Input node 338 might be also an internal node of sense amplifier 10 and coupled to bitline node 334 through capacitor 310. Output node 340 might be coupled to bitline node 336 through capacitor 312. The second inverter might include input node 342 and output node 344. Input node 342 might be another internal node of sense amplifier 300 and coupled to bitline node 336 through capacitor 312. Output node 344 might be coupled to bitline node 334 through capacitor 310.

Transmission gate switch 314 might be coupled between input node 338 of the first inverter and input node 342 of the second inverter. Transmission gate switch 316 might be coupled between common nodes 346, 348 of the first and second inverters. Transmission gate switches 314, 316 might be any existing and/or prospective circuits that can be used as a gate switch in the art.

Figure 4A:
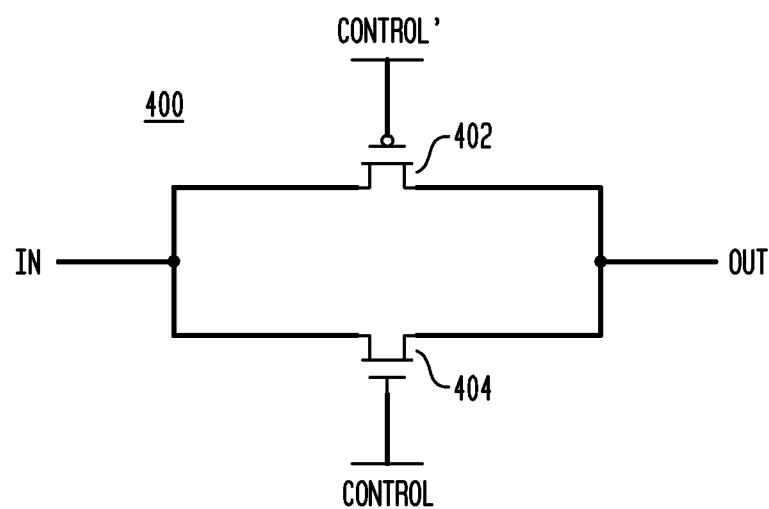
FIG. 4A is a schematic view of a switch used in the capacitive coupled sense amplifier shown in FIG. 3A and FIG. 3B in accordance with exemplary embodiments.
Figure 4B:
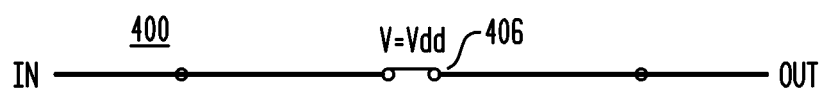
FIG. 4B shows a schematic view of the switch shown in FIG. 4A in a closed position.
Figure 4C:
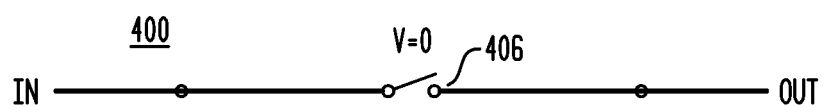
FIG. 4C shows a schematic view of the switch shown in FIG. 4A in an open position.

In one embodiment, transmission gate switches 314 and 316 each might include a PMOS transistor and a NMOS transistor. FIG. 4A, FIG. 4B and FIG. 4C show schematic views of a transmission gate switch used in the capacitive coupled sense amplifier shown in FIG. 3A and FIG. 3B in accordance with an exemplary embodiment. As shown in FIG. 4A, transmission gate switch 400 might include PMOS transistor 402 and NMOS transistor 404. PMOS transistor 402 and NMOS transistor 404 might be connected in parallel forming a logic transmission gate switch. When the control line is set high, i.e., the control' line goes to low, both NMOS and PMOS transistors 402, 404 might be closed and an input might be connected to an output. In this case, transmission gate switch 400 might act like a wire connecting IN (input) and OUT (output). When the control line is set low, when the control' line goes high, both NMOS and PMOS transistors 402 and 404 might be open. In this case, the input might be open-circuited, the output might not be connected to anything, and the cross-coupled latch coupled to transmission gate switch 400 might be set with the prior data. This might be called floating, i.e., a to pass from voltage is undefined in transmission gate switch 400. The control shown in FIG. 4A might be a voltage signal, or a clock signal, or any signal can be used as the control signal in the art. In one embodiment, the control signal might be the voltage signal. In this case, the voltage applied to NMOS and PMOS transistors 402 and 404 might be between a drain, supply voltage ($V_{dd}$) and ground zero. The voltage of transmission gate switch 400 might be $V_{dd}$, which might result in NMOS and PMOS transistors 402, 404 in transmission gate switch 400 being ON at the same time. This might cause a short-circuit as a switch is closed. Here, NMOS transistor 404 might allow the high control value the input to the output, and PMOS transistor 402 might allow only the low control value to pass from the input to the output. Together, NMOS and PMOS transistors 402 and 404 might cover both the low and high control values, making transmission gate switch 400 act like a switch closed when the control is set high, and a switch open when the control is set low.

A schematic view of gate switch 400 might be obtained using simple switches. FIG. 4B shows a schematic view of transmission gate switch 400 shown so FIG. 4A with a switch closed in accordance with as exemplary embodiment. FIG. 4C shows a schematic view of transmission gate switch 400 shown in FIG. 4A with the switch open in accordance with an exemplary embodiment.

As shown in FIG. 4B, when the voltage (V) is set high, for example, V=$V_{dd}$, transmission gate switch 400 might be closed allowing new input data pass through transmission gate switch 400. As shown in FIG. 4C, when the V is set low (i.e., V=0), transmission gate switch 400 might be opened and the cross-coupled latch coupled to transmission gate switch 400 might maintain at the prior data and no new data input into the cross-coupled latch.

Figure 5:
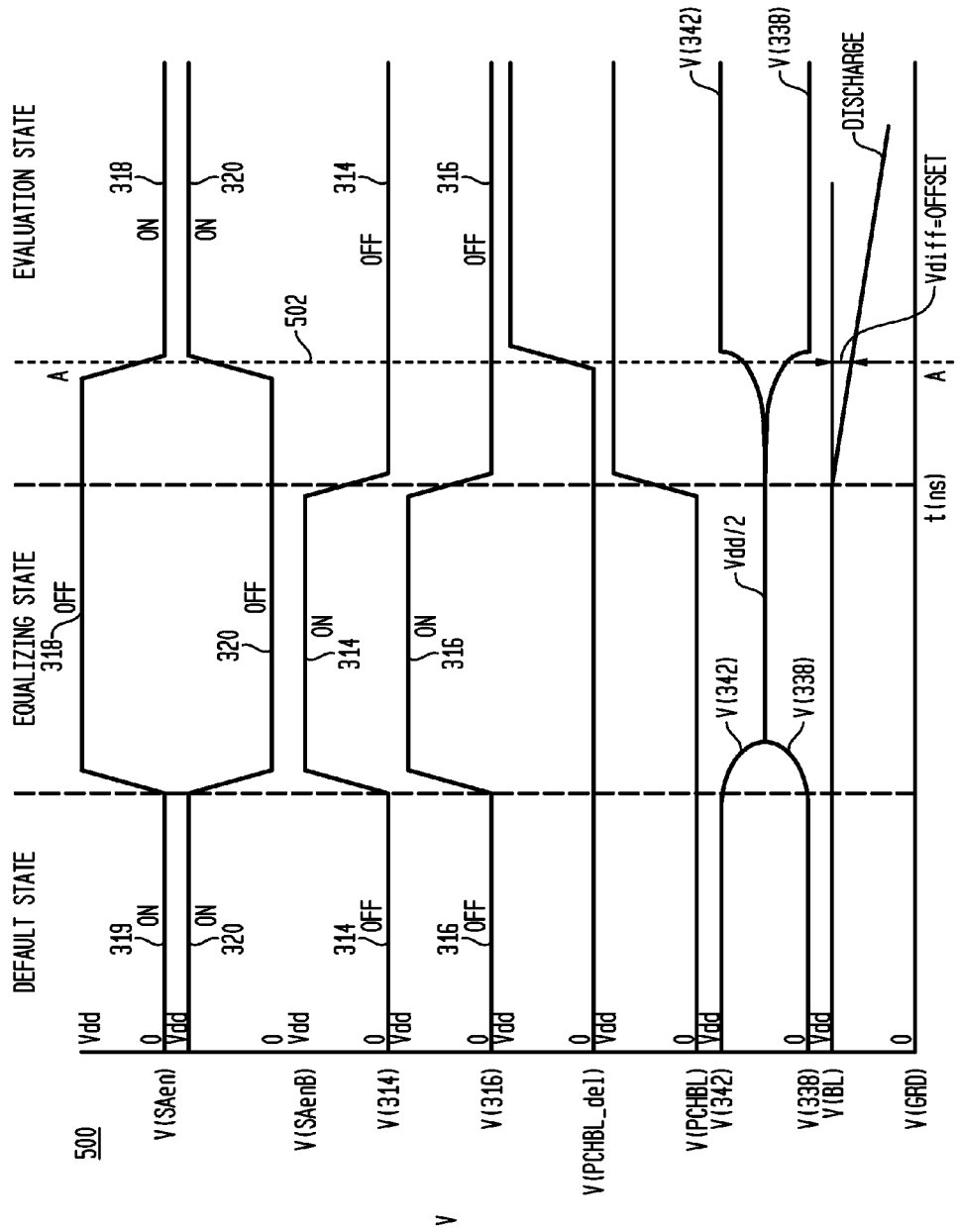
FIG. 5 is an exemplary timing diagram of the capacitive coupled sense amplifier shown in FIGS. 3A-3B.

FIG. 5 is a timing diagram showing exemplary wave forms of the capacitive coupled sense amplifier shown in FIG. 3A and FIG. 3B. As shown in FIG. 5, timing diagram 500 might be divided into three states: a default state, an equalizing state, and an evaluation state. The default state means internal nodes of a sense amplifier in the disclosed embodiments might be in my stable state following the previous operation. The equalizing state means voltage of the internal nodes of the sense amplifier might travel $V_{dd}/2$ to reach a High gain Point of $V_{dd}/2$ in a read cycle time. The evaluation state means a precharge to the sense amplifier might be turned OFF and bitlines discharge, making the internal nodes of the sense amplifier to shift from a Highly unstable state of $V_{dd}/2$ to stable state of 0 or $V_{dd}$. The default state, equalizing state and evaluation state are described in detail below.

Returning to FIG. 3A and FIG. 3B, precharge circuit 20 might precharge and equalize PMOS transistors 328, 330 and 332 for the BL and BLB. PCHBL might be a precharge signal shown as V(PCHBL) in FIG. 5 that might control PMOS transistors 328, 330 and 332. PMOS transistors 328, 330 and 332 might be used to precharge the BL and BLB to the drain supply voltage ($V_{dd}$) and equalize BL and BLB at $V_{dd}$. When precharging BL and BLB, the PCHBL signal (e.g., V(PCHBL) might be set low (e.g., 0 or ground) and all three PMOS transistors 328, 330 and 332 might work (see FIG. 5). Here, PMOS transistors 328 and 330 might act as resistances connecting BL and BLB to $V_{dd}$. PMOS transistor 332 might speed up a read operation by helping equalize voltages charged on BL and BLB. The PCHBL signal might be high (i.e., $V_{dd}$) when charging BL and BLB is complete. A flow of the read operation is described in detail below.

As shown in FIG. 3A and FIG. 3B, MUX passgates 30 and 40 are coupled to the GBL and GBLB, respectively, and then connected to the corresponding local BL and BLB. Mux passgates 30 and 40 might be controlled by the PCHBL_del signal. The PCHBL_del signal is a delayed version of PCHBL signal. The delay between PCHBL and PCHB_del should be sufficient enough to transfer the GBL discharge to the BL or the GBLB discharge to the BLB node. The positive edge (0 to vdd) of the PCHBL_del should coincide with the (0 to vdd) of the V(SAenB). When the PCHBL_del signal is set low (e.g., 0), Mux passgates 30 and 40 might be ON, resulting in the BL connected to the GBL and the BLB connected to the GBLB. Thus the BL might sense the capacitance of a GBL node. Similarly, the BLB might sense the capacitance of a GBLB node. In one embodiment, the capacitance of the GBL and GBLB might be approximately 50 femtofarads (ff), which is relatively higher because GBL and GBLB are global nodes, and the capacitance of BL and BLB might be approximately 5 ff, which is relatively low because BL and BLB are local nodes. If BL and BLB are decoupled/detached from GBL and GBLB in the evaluation state by turning MUX passgates 30 and 40 OFF (the PCHBL_del is set high (e.g., $V_{dd}$)), then in the evaluation state the capacitance sensed by sense amplifier 10 might be only the capacitance of BL and BLB, which is only 5 ff. Thus, an evaluation time might be reduced.

Since precharge circuit 20 and MUX passgates 30 and 40 each include PMOS transistors, precharge circuit 20 and MUX passgates 30 and 40 might turn ON and OFF with delay sufficient to transfer the GBL discharge to BL or GBLB discharge to BLB.

Returning to FIG. 3A and FIG. 5, sense amplifier 10 might start at the default state with transmission gate switches 314 and 316 open (OFF). As shown in FIG. 5, the voltages of transmission gate switches 314 and 316 corresponding to V(314) and V(316), respectively, are both low (e.g., V=0). In the default state, the PCHBL signal, V(PCHBL), might be set low (e.g., 0), then, precharge circuit 20 might be ON. Subsequently, the BL and BLB might be precharged. Since MUX passgates 30 and 40 are implemented with PMOS transistors and are controlled by V(PCBBL_del) signal, MUX passgates 30 and 40 might also be ON, resulting in the BL connecting to GBL and the BLB connecting to GBLB. In the default state, one sense amplifier enable signal (V(SAen)) applied to common node PMOS transistor 318 might be set low (e.g., V(SAen)=0), thus common node PMOS transistor 318 might be ON. The other sense amplifier enable signal (V(SAenB)) applied to common node NMOS transistor 320 might be set high (e.g., V(SAenB)=$V_{dd}$), thus, common node NMOS transistor 320 might also be ON. In this case, input nodes 318, 342 (i.e., internal nodes) of sense amplifier 10 might be in any stable state, 0, $V_{dd}$ or $V_{dd}$, 0, depending on the previous operation.

Next, sense amplifier 10 might move to the equalizing state when the read operation starts. Returning to FIG. 3B and FIG. 5, sense amplifier 10 might be in the equalizing state with transmission gate switches 314 and 316 closed (ON). This might be at the start of a read and write cycle. In this case, the SAen signal, V(SAen), might be set high (e.g., V(SAen)= $V_{dd}$) and the SAenB signal, V(SAenB), might be set low (e.g., V(SAen)=0), then common node PMOS transistors 318, 320 might be switched OFF. This might result in sense amplifier 10 in a $V_{dd}/2$ state as the voltages of input nodes 338, 342 (i.e., the internal nodes), V(319) and V(321), of sense amplifier 10 might be equalized and maintained at $V_{dd}/2$, i.e., V(309)= $V_{dd}/2$ and V(321)=$V_{dd}/2$. Furthermore, the voltage of common nodes 346, 348 of the first and second inverters might be equalized and maintained at $V_{dd}/2$ (not shown).

After sense amplifier 10 passes through the equalizing state, sense amplifier 10 might get into an evaluation state. At the evaluation state, the voltages of input nodes 338, 342 (i.e., the internal nodes) and common nodes 346, 348 might all be in stable states and balanced. Here, the PCHBL signal might be set high (e.g., V(PCHBL)=$V_{dd}$), which might turn OFF precharge circuit 20 and since there is a delay between V(PCHBL_del) and V(PCHBL) MUX passgates 30 and 40, BL and BLB are still coupled with GBL and GBLB, respectively, and when the Wordline is switched ON if GBL or GBLB is discharged, this discharge will be transferred to BL and BLB. Parallel to this process, transmission gate switches 314 and 316 might be switched OFF. The voltages of input nodes 338, 342 (i.e., the internal nodes) and common nodes 346, 348 might start to change to reach to the stable states. For example, as shown in FIG. 5, when BL starts to fall in the evaluation state, a voltage difference ($V_{diff}$) from the BL might start transferring from capacitor 310 to input node 338. Similarly, when the BLB starts to fall, a voltage difference ($V_{diff}$) from BLB might start transferring from capacitor 312 to input node 342 (not shown). When a sufficient $V_{diff}$ greater than an OFFSET of sense amplifier 10 has been transferred, as shown in FIG. 5, common node transistors 318 and 320 might be switched ON, which means that the SAenB signal might go from 0 to $V_{dd}$, the SAen signal might also go from 0 to $V_{dd}$, parallel to this PCHBL_del signal might go from 0 to $V_{dd}$, so as to decouple GBL and GBLB from BL and BLB respectively. This might turn out input node 338 might fall to 0 (i.e., V(338)=0) and input node 342 might increase to high or 1 (i.e., V(342)=$V_{dd}$). Here, the OFFSET represents a minimum $V_{diff}$ between internal nodes 338, 342 of sense amplifier 10 to resolve sense amplifier 10 in a correct and intended direction. This means how much V(338) should be brought lower than V(342) if internal node 338 goes to 0. Similarly, how much V(342) should be brought lower than V(338) if internal node 342 goes to 0. Vertical line A-A 502 on FIG. 5 marks a timing of the above process. As such, input nodes 338 and 342 (i.e., internal nodes) might just travel $V_{dd}/2$ to reach to stable states, respectively, resulting in input nodes 338 and 342 (i.e., internal nodes) or sense amplifier 10 at a maximum gain point in a read cycle time.

Accordingly, input nodes 338 and 342, i.e., internal nodes 338 and 342, of sense amplifier 10 might be kept at $V_{dd}/2$ in the stable states and balanced, rather than $V_{dd}$ as done in conventional sense amplifiers. This difference might be caused by the fact that BL and BLB are coupled to internal nodes 338 and 342 of sense amplifier 16 through respective capacitors 310 and 312, and two transmission gate switches 314 and 316 are employed.

Figure 6:
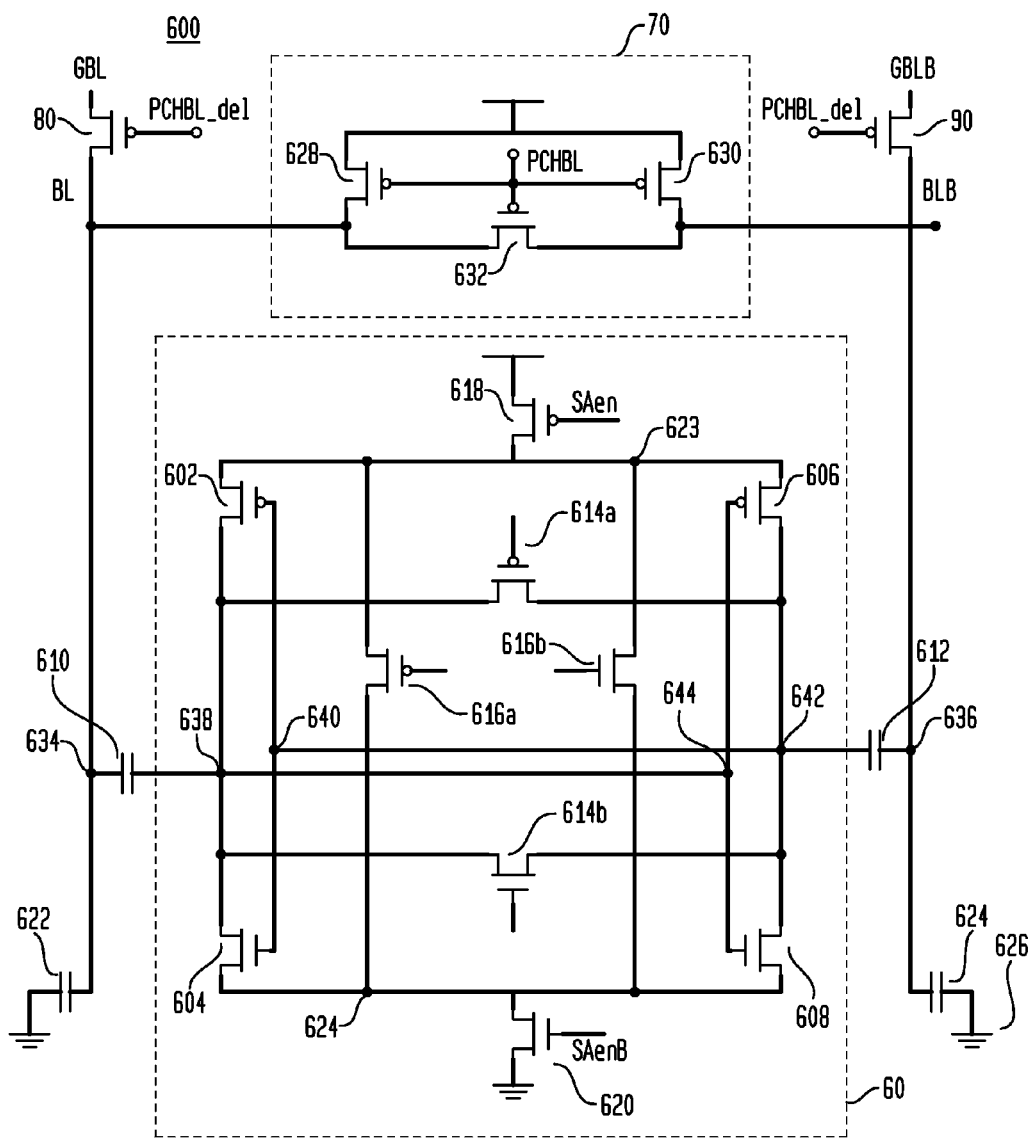
FIG. 6 is a schematic view of an embodiment of the capacitive coupled sense amplifier shown in FIGS. 3A-3B.

FIG. 6 is a schematic view of an implementation of the capacitive coupled sense amplifier shown in FIGS. 3A-3B in accordance with an exemplary embodiment. FIG. 7 is a timing diagram showing exemplary wave forms of the capacitive coupled sense amplifier shown in FIG. 6 in accordance with an exemplary embodiment. As shown in FIG. 6, PMOS transistor 662, NMOS transistor 604, PMOS transistor 606, NMOS transistor 608, capacitor 610, capacitor 612, common node PMOS transistor 618, common node NMOS transistor 620, PMOS transistors 628, 630 and 632, bitline nodes 634 and 636, input nodes 638 and 642, output nodes 640 and 644, and MUX passgates 80 and 90 are identical in constitution and operation to PMOS transistor 302, NMOS transistor 304, PMOS transistor 306, NMOS transistor 308, capacitor 310, capacitor 312, common node PMOS transistor 318, common, node NMOS transistor 320, PMOS transistors 328, 330 and 332, bitline nodes 334 and 336, input nodes 338 and 342, output nodes 340 and 344, and MUX passgates 30 and 40 illustrated in FIGS. 3A-3B.

FIGS. 3A-3B and FIG. 6 differ in that transmission gate switches 314, 316 of FIGS. 3A-3B are replaced in FIG. 6 by parallel connected PMOS transistor 614a and NMOS transistor 614b and parallel connected PMOS transistor 616a and NMOS transistor 616b, respectively, forming two switches.

At a default state, referring to FIG. 6, when a control signal for NMOS transistors 614b and 616b is set low (i.e., 0), NMOS transistors 614b and 616b and PMOS transistors 614a and 616a might all turn OFF, which is equivalent to the embodiment of FIG. 3A where transmission gate switches 314 and 316 all turn OFF. In this case, a SAen signal might be set low (i.e., V(SAen)=0) and a SAenB might be set high (i.e., V(SAen)=$V_{dd}$), then common node PMOS transistors 618, 620 might be switched ON. When a read operation starts, sense amplifier 60 might be at an equalizing state. In this case, sense amplifier 60 might be in the equalizing state with NMOS transistors 614b and 616b OFF and PMOS transistors 614a and 616a ON as shown in FIG. 7. Here, the SAen signal might be set high (i.e., V(SAen)=$V_{dd}$) and the SAenB might be set low (i.e., V(SAen)=0), then common node PMOS transistors 618, 620 might be switched OFF. This configuration might result in sense amplifier 60 in a $V_{dd}/2$ state as input nodes 638, 642 (i.e., internal nodes) of sense amplifier 60 might be equalized and maintained at $V_{dd}/2$, i.e., V(638)=$V_{dd}/2$ and V(642)=$V_{dd}/2$. Furthermore, common nodes 646, 648 of the first and second inverters might also be equalized and maintained at $V_{dd}/2$ (not shown), which might be equivalent to the embodiment of FIG. 3B where transmission gate switches 314 and 316 all turn ON.

Following the equalizing state, sense amplifier 60 might transition to an evaluation state. At the evaluation state, input nodes 638, 642 (i.e., internal nodes) and common nodes 646, 648 might all be in stable states and balanced. Here, the PCHBL signal might be set high (i.e., V(PCJBL)=$V_{dd}$), which, might turn OFF precharge circuit 70 and since there is a delay between PCHBL_del and PCHBL MUX passgates 80 and 90, BL and BLB are still coupled from GBL and GBLB, respectively, and when the Wordline is switched ON if GBL or GBLB is discharged, this discharge will be transferred to BL and BLB. Parallel to this process, NMOS transistors 614b and 616b and PMOS transistors 614a and 636a might be switched OFF. Input nodes 638, 642 (i.e., internal nodes) and common nodes 646, 648 might start to change to reach to the stable states. For example, as shown in FIG. 7, when BL starts to fall, a voltage difference ($V_{diff}$) from BL might start transferring from capacitor 610 to input node 638. Similarly, when BLB starts to fall, a voltage difference ($V_{diff}$) from BLB might start transferring from capacitor 612 to input node 642 (not shown). When a sufficient $V_{diff}$ greater than an OFFSET of sense amplifier 60 has been transferred, as shown in FIG. 7, common node transistors 618 and 620 might be switched ON, such that the SAenB signal might transition from 0 to $V_{dd}$ and the SAen signal might also transition from 0 to $V_{dd}$. As a consequence, input node 638 might fall to 0 (i.e., V(638)=0) and input node 642 might increase to high or 1 (i.e., V(642)=$V_{dd}$). Here, the OFFSET represents a minimum $V_{diff}$ between internal nodes 638, 642 of sense amplifier 60 to resolve sense amplifier 60 in a correct and intended direction, and this relates to an amount that V(638) be desirably brought lower than V(642) if internal node 638 goes to logic 0. Similarly, this relates to an amount that V(642) be desirably brought lower than V(638) if internal node 642 goes to 0. Vertical line A-A 702 on FIG. 5 marks a timing of the above process. As such, input nodes 638 and 642 (i.e., internal nodes) might just travel $V_{dd}/2$ to reach to stable states, respectively, and might be balanced. This might result in input nodes 638 and 642 (i.e., internal nodes) or sense amplifier 60 at a maximum gain point in a read cycle time.

FIG. 8 is a flowchart showing a method for sensing a bitline voltage difference in a SRAM by the capacitive based sense amplifier shown in FIGS. 3A-3B and FIG. 5 biased at a maximum gain point in accordance with an exemplary embodiment.

As shown, at step 802, sense amplifier 10 might start a default state. At the default state, bitlines BL and BLB might be precharged to $V_{dd}$ with precharging circuit 20 when a PCHBL signal is set at low (i.e., 0). Simultaneously, MUX passgates 30 and 40 might also be ON and BL and BLB might be connected to GBL and GBLB, respectively. Furthermore, transmission gate switches 314 and 316 might be switched OFF and common node transistors 318 and 320 of sense amplifier 10 might be switched ON. In this case, input nodes 338, 342 (i.e., internal nodes) of sense amplifier 10 might be in any stable state, 0, 1 or 1, 0, depending on the previous operation.

At step 804, sense amplifier 10 might execute an equalizing state, which might occur at the start of a read and write cycle. In the equalizing state, transmission gate switches 314 and 316 might be closed (ON). In this case, common node PMOS transistors 318, 320 might be switched OFF, causing sense amplifier 10 to be in a $V_{dd}/2$ state as input nodes 338, 342 (i.e., the internal nodes) of sense amplifier 10 might be equalized and kept at $V_{dd}/2$, as shown in FIG. 5. Furthermore, the voltages of common nodes 346, 348 of the first and second inverters might also be equalized and maintained at $V_{dd}/2$ (not shown).

At step 806, precharge circuit 20 might be switched OFF with the PCHBL signal, V(PCHBL), set at high (i.e., $V_{dd}$), and sense amplifier 10 might then get into an evaluation state. In the evaluation state, Wordline might be switched ON, which results in the GBL and GBLB discharging and when the discharge of the GBL and GBLB is transferred to the BL and the BLB, and the discharge of the BL and BLB is further transferred through coupling capacitors 310, 312 to input nodes 338, 342 (i.e., internal nodes) of the sense amplifier. Then, the GBL and BL, and GBLB and BLB are decoupled, respectively, by switching OFF the MUX passgates. In this case, transmission gate switches 314 and 316 might be switched OFF, input nodes 338, 342 (i.e., the internal nodes) and common nodes 343, 348 might move toward stable states.

At step 808, as shown in FIG. 5, in the evaluation state, when the BL starts to fall, a voltage difference ($V_{diff}$) from the BL might start transferring from capacitor 310 to input node 338. Similarly, when the BLB starts to fall, a voltage difference ($V_{diff}$), which is a voltage difference between input nodes 338 and 342 (internal nodes), from the BLB might start transferring from capacitor 312 to input node 342 (not shown). When a sufficient $V_{diff}$ greater than an OFFSET of sense amplifier 10 has been transferred, as shown in FIG. 5, common node transistors 318 and 320 might be switched ON, which means that the SAenB signal might transition from 0 to $V_{dd}$ and the SAen signal might also transition from 0 to $V_{dd}$. This might turn out input node 338 might fall to 0 (i.e., V(338)=0) and input node 342 might increase to high or 1 (i.e., V(342)=$V_{dd}$). Here, the OFFSET represents a minimum $V_{diff}$ between internal nodes 338, 342 of sense amplifier 10 to resolve sense amplifier 10 in a correct and intended direction, and this relates to an amount that V(338) should be brought lower than V(342) if internal node 338 goes to 0. Similarly, how much V(342) should be brought lower than V(338) if internal node 342 goes to 0. As such, input nodes 338 and 342 (i.e., the internal nodes) might travel $V_{dd}/2$ to reach to corresponding stable states and might be balanced, similarly to common nodes 346, 348. This configuration might result in input nodes 338 and 342 (i.e., internal nodes) or sense amplifier 10 being at a maximum gain point in a read cycle time.

The advantages of the capacitive based sense amplifier in the described embodiments might include the voltages of the internal nodes of the sense amplifier kept at $V_{dd}/2$, which is a maximum gain point of the sense amplifier. Thus, a slight difference in a voltage level of the internal nodes might be magnified to fully swing $V_{dd}$ at 0 for each internal node. Because a capacitor is used to transfer the $V_{diff}$ from the bitlines to the internal nodes of the sense amplifier, a load of the internal nodes of the sense amplifier and a load of the bitlines of the memory cell might not sense each other. This configuration might assist in improving a discharge rate of the bitlines since the bitlines have less capacitance. Techniques of the present embodiments might be used independently of the size of the sense amplifier.

Furthermore, in the described embodiments, after the sense enable signal, there are two inverters to output generated sense amplifier signals. While in the conventional sense amplifiers, there are generally four inverters after the sense enable signal. Thus, in the described embodiments, there might be a direct gain of a two inverter delay.

Furthermore, in the conventional sense amplifiers, due to a difference in a precharge level of bitlines, some margin equal to the above difference might be added to an offset of the sense amplifier. Whereas, in the described embodiments, there might not need to add the difference in the levels of the bitlines due to a leakage difference to the offset of the sense amplifier.

Furthermore, in dual rail compilers in case the difference between periphery and array supply is very huge, a static noise margin (SNM) issue might appear. For example, a periphery is 0.6 and an array is 1.0 in a SRAM cell. Since a bitline is at 0.6, when a wordline is switched on a side where 1.0 is stored in the memory cell, the bitline at 0.6 might start discharging, and instead of read happening from the other side (as will happen in a normal case), a write might start happening from the side resulting in flipping the memory cell. The solution of this problem might bring the bitline on the array. Then, the bitline precharging circuitry, column detection circuitry, sense amplifier might also have to bring on the array. It is acceptable to bring the bitline precharging circuitry and the column detection circuitry on the array. But, when the sense amplifier is brought on the array, a power consumption of the array might be increased, which might cause to prevent inverters after the sense amplifier from going to the array. This might be a tedious task, and penalize an area of the array. However, in the described embodiments, the sense amplifier might be isolated from the bitlines, such that the bitlines might be on a different power supply from the sense amplifier.

Reference herein to "one embodiment" or "an embodiment" means that a particular feature, structure, or characteristic described in connection with the embodiment can be included in at least one embodiment. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations.

That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the embodiments are not so limited. As would be apparent to one skilled in the art, various functions of circuit elements may also be implemented as processing blocks in a software program. Such software may be employed in, for example, a digital signal processor, micro-controller, or general purpose computer.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the embodiment is implemented using bi-polar transistor technology.

No claim element herein is to be construed under the provisions of 35 U.S.C. §112, sixth paragraph, unless the element is expressly recited using the phrase "means for" or "step for."

It will be further understood that various changes in the details, materials, and arrangements of the parts which have been described and illustrated in order to explain the nature of described embodiments may be made by those skilled in the art without departing from the scope as expressed in the following claims.

I claim:

1. A sense amplifier coupled between a complementary pair of first and second bitlines that are coupled to respective first and second global bitlines in a static random access memory (SRAM) cell, the sense amplifier comprising:
a first inverter including a first input node and a first output node, the first input node coupled to the first bitline through a first capacitor, the first output node coupled to the second bitline through a second capacitor;
a second inverter including a second input node and a second output node, the second input node coupled to the second bitline through the second capacitor, the second output node to the first bitline through the first capacitor;
a first transmission gate switch coupled between the first input node and the second input node; and
a second transmission gate switch coupled between a first common node of the first and second inverters and a second common node of the first and second inverters,
wherein the sense amplifier is maintained at a maximum gain point in a read cycle of the SRAM cell.

2. The sense amplifier of claim 1, further comprising a common node PMOS transistor at the first common node and a common node NMOS transistor at the second common node.

3. The sense amplifier of claim 1, wherein the maximum gain point is a half of a drain supply voltage ($V_{dd}/2$).

4. The sense amplifier of claim 1, wherein the first and second transmission gate switches are formed by a NMOS transistor and a PMOS transistor in parallel.

5. The sense amplifier of claim 1, wherein the first and second bitlines are precharged to a drain supply voltage ($V_{dd}$) with a precharging circuit.

6. The sense amplifier of claim 5, wherein the precharging circuit includes three PMOS transistors in series, and the three PMOS transistors are triggered together with a charging signal.

7. The sense amplifier of claim 1, wherein the first and second bitlines are coupled to the first and second global bitlines by a respective multiplexer PMOS transistor.

8. The sense amplifier of claim 1, wherein the internal nodes are maintained at a maximum gain point in a read cycle time.

9. A method for sensing a bitline voltage difference with a sense amplifier in a static random access memory (SRAM), the method comprising the steps of:

starting a default state of the sense amplifier with precharging a complimentary pair of bitlines to a drain supply voltage ($V_{dd}$), connecting the bitlines to corresponding global bitlines, switching transmission gate switches OFF and switching common node transistors of the sense amplifier ON, wherein each bitline is coupled to the corresponding global bitline with a multiplexer transistor and coupled to the sense amplifier with a corresponding capacitor;

when a read operation starts, executing an equalizing state of the sense amplifier with the transmission gate switches ON and the common node transistors OFF, wherein the voltages of internal nodes of the sense amplifier are equalized and maintained at a half of the drain supply voltage ($V_{dd}/2$);

moving to the evaluation state of the sense amplifier, the wordline is switched ON, the precharge transistors on the bitlines are switched OFF, the Global Bitlines starts to discharge, which being connected to bitlines make them also discharge; and in the evaluation state, when a voltage difference ($V_{diff}$) from the bitlines transfers from the capacitor to internal nodes of the sense amplifier to a certain point, switching the common node transistors ON and turning OFF the transmission gates, wherein at the certain point, the internal nodes reach to the stable states by travelling $V_{dd}/2$, resulting in the sense amplifier biased at a maximum gain point in a read/write cycle time.

10. The method of claim 9, wherein the maximum gain point is a half of the drain supply voltage ($V_{dd}/2$).

11. The method of claim 9, wherein the certain point is a point that a voltage difference is greater than an OFFSET of the sense amplifier, wherein the OFFSET is a minimum voltage difference between the internal nodes of the sense amplifier to resolve the sense amplifier in a correct and intended direction.

12. The method of claim 9, wherein the internal nodes reach to the stable states with one internal node falling to 0 and the other internal node reaching to $V_{dd}$.

13. The method of claim 9, wherein the transmission gate switches are formed by a NMOS transistor and a PMOS transistor in parallel, respectively.

14. The method of claim 9, wherein the complimentary pair of bitlines are coupled to a complimentary pair of global bitlines by a respective multiplexer PMOS transistor, respectively.

15. An integrated circuit comprising:
a complimentary pair of bitlines coupled to a respective complimentary pair of global bitlines;
a first inverter including a first input node and a first output node, the first input node coupled to a first bitline through a first capacitor, the first output node coupled to a second bitline through a second capacitor;
a second inverter including a second input node and a second output node, the second input node coupled to the second bitline through the second capacitor, the second output node to the first bitline through the first capacitor;
a first transmission gate switch coupled between the first input node and the second input node; and
a second transmission gate switch coupled between a first common node of the first and second inverters and a second common node of the first and second inverters,
wherein the first input node and the second output node are maintained at a maximum gain point in a read cycle.

16. The integrated circuit of claim 15, further comprising a common node PMOS transistor at the first common node and a common node NMOS transistor at the second common node.

17. The integrated circuit of claim 15, wherein the maximum gain point is a half of a drain supply voltage ($V_{dd}/2$).

18. The integrated circuit of claim 15, wherein the first and second transmission gate switches are formed by a NMOS transistor and a PMOS transistor in parallel.

19. The integrated circuit of claim 15, wherein the first and second bitlines are precharged to a drain supply voltage ($V_{dd}$) with a precharging circuit.

20. The integrated circuit of claim 15, wherein the first and second bitlines are coupled to the first and second global bitlines by a respective multiplexer PMOS transistor.

* * * * *